(12) United States Patent
Swazey

(10) Patent No.: US 6,738,604 B2
(45) Date of Patent: May 18, 2004

(54) PROGRAMMABLE IF BANDWIDTH USING FIXED BANDWIDTH FILTERS

(75) Inventor: Scott T. Swazey, San Diego, CA (US)

(73) Assignee: Qualcomm, Inc., San Diego, CA (US)

( * ) Notice: Subject to any disclaimer, the term of this patent is extended or adjusted under 35 U.S.C. 154(b) by 115 days.

(21) Appl. No.: 09/919,693

(22) Filed: Jul. 31, 2001

(65) Prior Publication Data

US 2003/0027534 A1 Feb. 6, 2003

(51) Int. Cl.$^7$ ................................................. H01Q 11/12
(52) U.S. Cl. ..................... 455/118; 455/180.1; 455/141; 455/313
(58) Field of Search ........................... 455/180.1, 188.1, 455/189.1, 141, 143, 144, 112, 118, 552, 553, 550, 313, 314, 552.1, 553.1

(56) References Cited

U.S. PATENT DOCUMENTS

| | | | |
|---|---|---|---|
| 4,972,455 A | * | 11/1990 | Phillips et al. ............... 455/552 |
| 5,758,296 A | * | 5/1998 | Nakamura ................... 455/575 |
| 5,995,815 A | * | 11/1999 | Blom ....................... 455/189.1 |
| 6,215,988 B1 | * | 4/2001 | Matero ..................... 455/188.1 |
| 6,404,293 B1 | * | 6/2002 | Darabi et al. ................. 331/37 |

FOREIGN PATENT DOCUMENTS

EP       0 537 960 A1  * 12/1992  ............ H04B/1/16

* cited by examiner

*Primary Examiner*—Sonny Trinh
(74) *Attorney, Agent, or Firm*—Philip Wadsworth; Charles D. Brown; Howard H. Seo

(57) ABSTRACT

A programmable IF bandwidth is achieved in either a transmitter or receiver using fixed bandwidth filters. A minimum of two IF frequencies are used. A fixed bandwidth filter that is equal to or greater than the desired IF bandwidth is used at each IF. The Local Oscillators (LO's) are tuned to frequency convert the desired signal to a frequency that is offset towards one bandedge of the fixed IF filters. A first mixer and LO relocates the desired signal to one end of a first fixed IF filter. A second mixer and LO relocates the filtered signal to the opposite end of a second IF filter. The desired bandwidth is obtained as the sum of the frequency offset of the desired signal from the nearest bandedge of the first IF filter and the frequency offset of the desired signal from the opposite bandedge of the second IF filter.

14 Claims, 6 Drawing Sheets

PROGRAMMABLE IF BANDWIDTH USING FIXED BANDWIDTH FILTERS

BACKGROUND

I. Field of the Invention

The present invention relates to electronic communications. More particularly, the present invention relates to Intermediate Frequency (IF) filtering.

II. Description of the Related Art

Electronic communication devices often modulate the desired signal onto a RF carrier frequency to provide frequency diversity over a plurality of channels. The distinct frequencies may then be simultaneously transmitted across a single link with a minimum of interaction between the plurality of channels. The link may be a single wire, multiple wires, coaxial transmission line, wireless link, optical fiber, or any other known communication link.

In a transmitter, baseband signals are upconverted onto a desired transmit frequency. While in a receiver, the received signal is downconverted to a baseband signal. The upconversion in a transmitter, and complementary downconversion in a receiver, is often performed in a plurality of stages rather than a single conversion.

Many communication devices utilize a dual conversion architecture design for the receiver and transmitter. FIG. 1 shows a block diagram of a wireless transceiver such as may be used in a wireless phone. Although a transceiver is shown in FIG. 1, it can be seen that the component parts may be isolated to perform only the transmitter or receiver functions. Similarly, although a wireless transceiver is shown in FIG. 1, a wire line device may be configured by eliminating the antenna or coupling the antenna to a wire line connection.

An antenna 10 may be used to interface the wireless device 100 to incoming radio waves. The antenna 10 may also be used to broadcast the signal from the transmitter. Incoming radio waves coupled to the wireless device 100 at the antenna 10 are next coupled to a duplexer 20. The duplexer 20 filters the incoming receive band signal but may also be used to electrically isolate the transmit power from the receive path while allowing the transmitter and receiver to use the same antenna. The duplexer 20 couples the signals in the receive path to a Low Noise Amplifier (LNA) 22 while simultaneously rejecting signals outside of the receive band. Ideally, the duplexer 20 rejects all signals in the transmit band such that they do not interfere with the receive band signals. However, practical implementations of duplexers 20 provide only limited rejection of signals in the transmit band.

The LNA 22 following the duplexer 20 is used to amplify the receive signal. The LNA 22 may also be the major contributor to the receiver's noise figure. The noise figure of the LNA 22 adds directly to the noise figure of the receiver while the noise figure of subsequent stages is reduced in proportion to the LNA 22 gain. Thus, the LNA 22 is typically chosen to provide a minimal noise figure in the receive band while amplifying the receive signal with sufficient gain to minimize noise figure contributions from subsequent stages. There are competing design requirements, such as DC power requirements and device third order intercept point, that make the choice of LNA 22 gain a trade off of many design constraints. The signal amplified in the LNA 22 is coupled to an RF filter 24. The RF filter 24 is used to provide further rejection to signals outside of the receive band. The duplexer 20 may not be capable of supplying sufficient rejection of signals outside of the receive band so the RF filter 24 supplements the prior filtering. The RF filter 24 is used after, rather than before, the first LNA 22 stage in order to reduce the filter's contribution to the receiver noise figure. The output of the RF filter 24 is coupled to a second LNA 26. The second LNA 26 is used to further amplify the received RF signal. A second LNA 26 stage is typically used where sufficient gain cannot be achieved in a single LNA stage while also satisfying third order intercept constraints. The output signal from the second LNA 26 is coupled to an input of a RF mixer 30.

The RF mixer 30 mixes the amplified receive signal with a locally generated frequency signal to downconvert the signal to an Intermediate Frequency (IF). The IF output of the RF mixer 30 is coupled to an IF amplifier 32 that is typically used to increase the signal level. The IF amplifier 32 typically has limited frequency response and does not amplify the upconverted signal that is output from the RF mixer 30. The output of the IF amplifier 32 is coupled to an IF filter 34.

The IF filter 34 is used to filter the IF from a single receive channel. The IF filter 34 typically has a much narrower frequency response than does the RF filter 24. The IF filter 32 can have a much narrower bandwidth since the RF mixer 30 typically downconverts the desired RF channel to the same IF regardless of the frequency of the RF channel. In contrast, the RF filter 24 must pass the entire receive band since any channel in the receive band can be allocated to the communication link. The output of the IF filter 34 is coupled to a receive Automatic Gain Control (AGC) amplifier 36. The AGC amplifier 36 is used to maintain a constant amplitude in the receive signal for the subsequent stages. The gain of the AGC amplifier 36 is varied using a control loop (not shown) that detects the amplitude of the amplifier's output. The output from the AGC amplifier 36 is coupled to an IF mixer 40.

The IF mixer 40 downconverts the IF signal to a baseband signal. The Local Oscillator (LO) used in conjunction with the IF mixer 40 may be separate and distinct from the first LO 150. The baseband output of the IF mixer 40 is coupled to a baseband processor 102. The baseband processor 102 block represents subsequent processing that is performed on the baseband signal. Examples of subsequent processing include, but are not limited to, despreading, deinterleaving, error correction, filtering, and amplification. The received information is then routed to the appropriate destination. The information may be used within the wireless device or may be routed to a user interface such as a display, loudspeaker, or data port.

The same baseband processor 102 may also be used in the complementary transmitter. Information to be transmitted is input to the baseband processor 102 where it may be, for example, interleaved, spread, and encoded. The processed signal is coupled to a transmit IF mixer 110 where the baseband signal is upconverted to a transmit IF. The transmit LO 112 used in conjunction with the transmit IF mixer 110 is generated separately from the first LO 150 and the receive IF LO 42.

The upconverted transmit IF signal output from the IF mixer 110 is coupled to a transmit AGC amplifier 114. The transmit AGC amplifier 114 is used to control the amplitude of the transmit IF signal. Amplitude control of the IF signal may be required to ensure the signal is maintained within the linear regions of all subsequent amplifier stages. The output of the AGC amplifier 114 is coupled to a transmit IF filter 116 that is used to reject unwanted mixer and amplifier products. The filtered output is coupled to a transmit RF mixer 120. The transmit RF mixer 120 is used to upconvert the transmit IF to the proper transmit RF frequency.

The upconverted RF output from the transmit RF mixer 120 is coupled to a first transmit RF filter 122. The first transmit RF filter 122 is used to reject undesired mixer products. The output of the first transmit RF filter 122 is coupled to a driver amplifier 124. The driver amplifier 124 amplifies the signal to a level desired by the subsequent power amplifier 128. Before the signal is applied to the power amplifier 128 the signal is filtered in a second transmit RF filter 126. The second transmit RF filter 126 is used to further reject mixer products and is also used to reject out of band products that are generated by the driver amplifier 124. The out of band products generated by the driver amplifier 126 may be harmonic products generated by driving the amplifier into a non-linear operating range. The output from the second transmit RF filter 128 is coupled to a high power amplifier 128. The high power amplifier 128 is used to amplify the transmit signal to a power level sufficient to ensure a communication link to a recipient. The output of the high power amplifier 128 is coupled to an isolator 130.

The isolator 130 is used to protect the output of the high power amplifier 128. Signals from the high power amplifier 128 are able to pass through the isolator 130 with minimal loss but signals that are incident at the output of the isolator 130 are greatly attenuated at the input to the isolator 130. Thus, the isolator 130 provides a good impedance match to the output of the high power amplifier 128 and protects the amplifier from reflected signals due to impedance mismatches in subsequent stages. The output of the isolator 130 is coupled to the duplexer 20 that is used to couple the transmit signal to the single antenna 10 while simultaneously rejecting the transmit signal from the receive path.

A baseband processor 102 may be capable of processing signals having multiple formats. A transceiver operating in a communication system in accordance with Telecommunications Industry Association (TIA)/Electronics Industries Association (EIA) IS-95-B, MOBILE STATION-BASE STATION COMPATIBILITY STANDARD FOR DUAL-MODE SPREAD SPECTRUM SYSTEMS must be capable of operating in analog mode as well as in digital Code Division Multiple Access (CDMA) mode. One problem associated with operating in multiple communication modes is the different IF bandwidth requirements of the different modes. In the IS-95-B specification, the analog channels operate in 30 KHz bands while the CDMA channels operate in 1.23 MHz bands. The different IF bandwidths may be accommodated using multiple IF filters, with a particular IF filter assigned to a particular mode. A switching circuit must be used to switch the appropriate IF filter into the signal path to correspond with the operating mode. However, the use of multiple IF filters and a switching circuit to accommodate multiple IF bandwidths of multiple operating modes is not ideal. An IF filter is required for each operating mode and additional modes require additional IF filters. What is needed is a programmable IF bandwidth that is capable of accommodating multiple IF bandwidths without the need for multiple filter configurations. The single configuration should be able to conform to multiple IF bandwidths required by multiple operating modes.

SUMMARY

The present embodiments disclose is a novel and improved method and apparatus of providing a programmable IF bandwidth using fixed bandwidth IF filters.

In one embodiment two frequency conversions are used with a fixed bandwidth IF filter following each frequency conversion. The first Local Oscillator (LO) for the first frequency conversion is tuned such that the center frequency of the desired signal is converted to a frequency that is near one bandedge of a first IF filter. The spacing between the center frequency and the nearest bandedge is chosen to be one half of the desired IF bandwidth. Then the second LO used in the second frequency conversion is tuned such that the spacing between the center frequency and the nearest bandedge of a second IF filter is equal to one half the desired IF bandwidth. When the second LO is tuned such that the second IF filter rejects signals not filtered by the first IF filter, the result is a tunable IF filter having the desired bandwidth.

In a first embodiment the first LO converts the desired signal to a center frequency such that the frequencies above the center frequency are attenuated using a first IF filter. The second LO converts the desired signal to a center frequency such that the frequencies below the center frequency are attenuated using the second IF filter. The result is an IF bandwidth that is the result of the placement of the desired signal relative to the two IF filter bandedges.

The first and second IF filters may be bandpass filters, lowpass filters, highpass filters, or any combination of bandpass, lowpass, and highpass filters. The desired signal may be offset towards the upper or lower bandedge when bandpass filters are used. The desired signal must be offset towards the bandedge when either a highpass or lowpass filter is used. If a highpass filter is used only the frequencies above the center frequency may be attenuated. Similarly, when a lowpass filter is used only the frequencies below the desired center frequency may be attenuated. The terms above and below the center frequency are relative to the particular frequency spectrum since the frequency conversion may result in a spectral inversion.

The input signal is frequency converted to a first IF where a first IF filter establishes a first bandwidth of a desired IF signal. The signal output from the first IF filter is frequency converted to a second IF where a second IF filter establishes a second bandwidth of the desired IF signal. The first bandwidth of the desired IF signal may be the upper bandwidth denoting the frequencies above a desired IF center frequency. Similarly, the second bandwidth of the desired IF signal may be the lower bandwidth denoting the frequencies below the desired IF center frequency.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
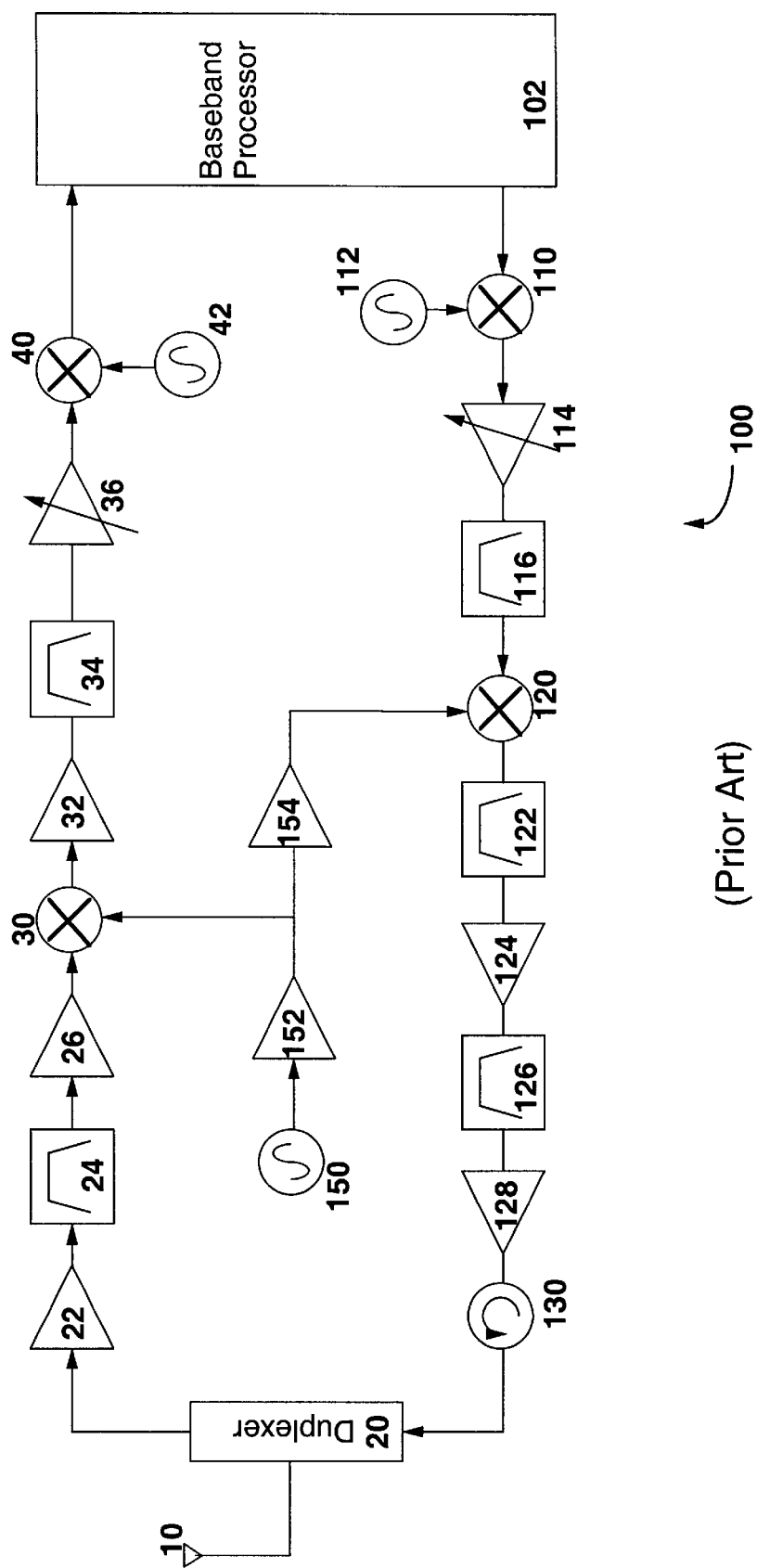
FIG. 1 is a block diagram of a wireless communication transceiver.
Figure 2:
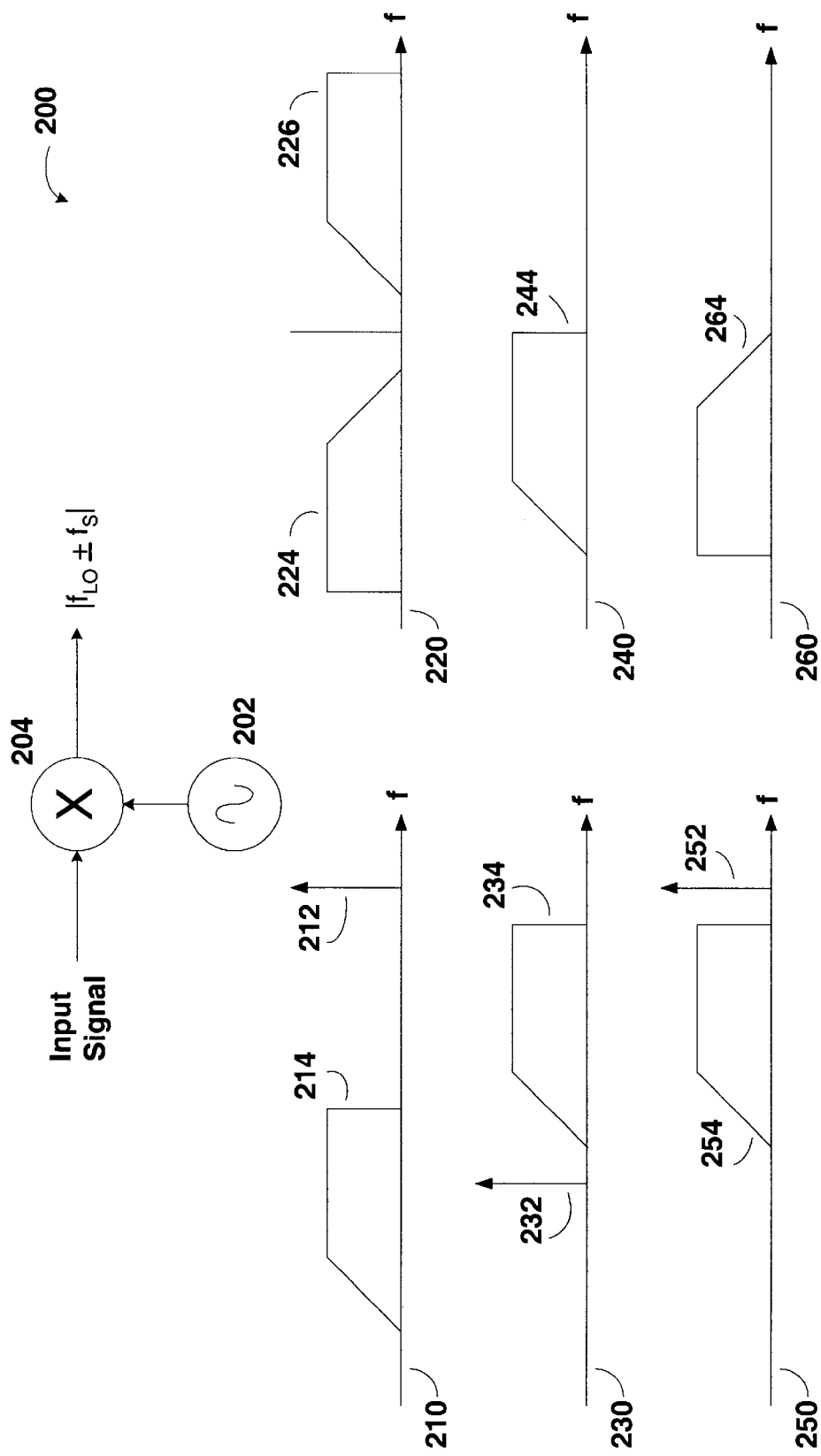
FIG. 2 is a block diagram of frequency conversion using a mixer and corresponding spectrum diagrams.

FIG. 2 shows a block diagram of a mixer 204 and LO 202 implemented as a frequency conversion device 200. The frequency conversion device 200 may be used to upconvert or downconvert a signal. A signal is input to a first port of the mixer 204 and the LO signal is input to a second port of the mixer 204. The mixer 204 outputs a signal that has frequency components at the sum and difference of the frequencies of the input signal and the LO 202 frequency. The placement of the LO 202 frequency in relation to the input signal determines if the output signal is a frequency upconversion or frequency downconversion.

Spectra showing an exemplary upconversion is shown in 210 and 220. The exemplary input signal 214 is shown to be a signal of finite bandwidth centered at a relatively low frequency relative to the frequency of the LO 212. The input signal 214 is shown as a nonsymmetrical signal to help show the spectral inversion capabilities of a frequency conversion. The actual frequency characteristics of the input signal 214 do not affect the frequency conversion. The upconverted output of the frequency conversion is shown in 220. Replicas of the input signal are converted to signals above 226 the LO frequency and signals below 224 the LO frequency. Note that the upconverted difference component 224 is a spectrally inverted replica of the input signal 214.

Exemplary spectrum diagrams 230 and 240 show the frequency spectra of a frequency downconversion implementation where the LO frequency 232 is below the frequency of the input signal 234. Spectrum diagram 230 shows the input signal 234 relatively close to the LO frequency 232. Spectrum diagram 240 shows the spectrum of the frequency downconversion achieved by filtering out the sum frequency component and keeping only the difference frequency component. Alternatively, the downconversion may be accomplished using a Single Side Band (SSB) mixer where substantially the difference is the only frequency component output from the mixer. This LO configuration results in a spectrally preserving downconversion.

Spectrum diagrams 250 and 260 show the frequency spectra of a frequency downconversion implementation where the LO frequency 252 is above the frequency of the input signal 254. The spectrum of the frequency downconverted output is shown in spectrum diagram 260. As in spectrum diagram 240, spectrum diagram 260 shows only the difference frequency component 264 that may be achieved by filtering out the sum frequency component or through the use of a SSB mixer. However, it is important to note that the difference frequency component 264 is spectrally inverted from the spectrum of the input signal 254.

Thus, spectrum diagrams 210 through 260 show that frequency conversion can be used to upconvert or downconvert signals and that the resultant output spectrum can preserve or spectrally invert the input signal spectrum.

Figure 3:
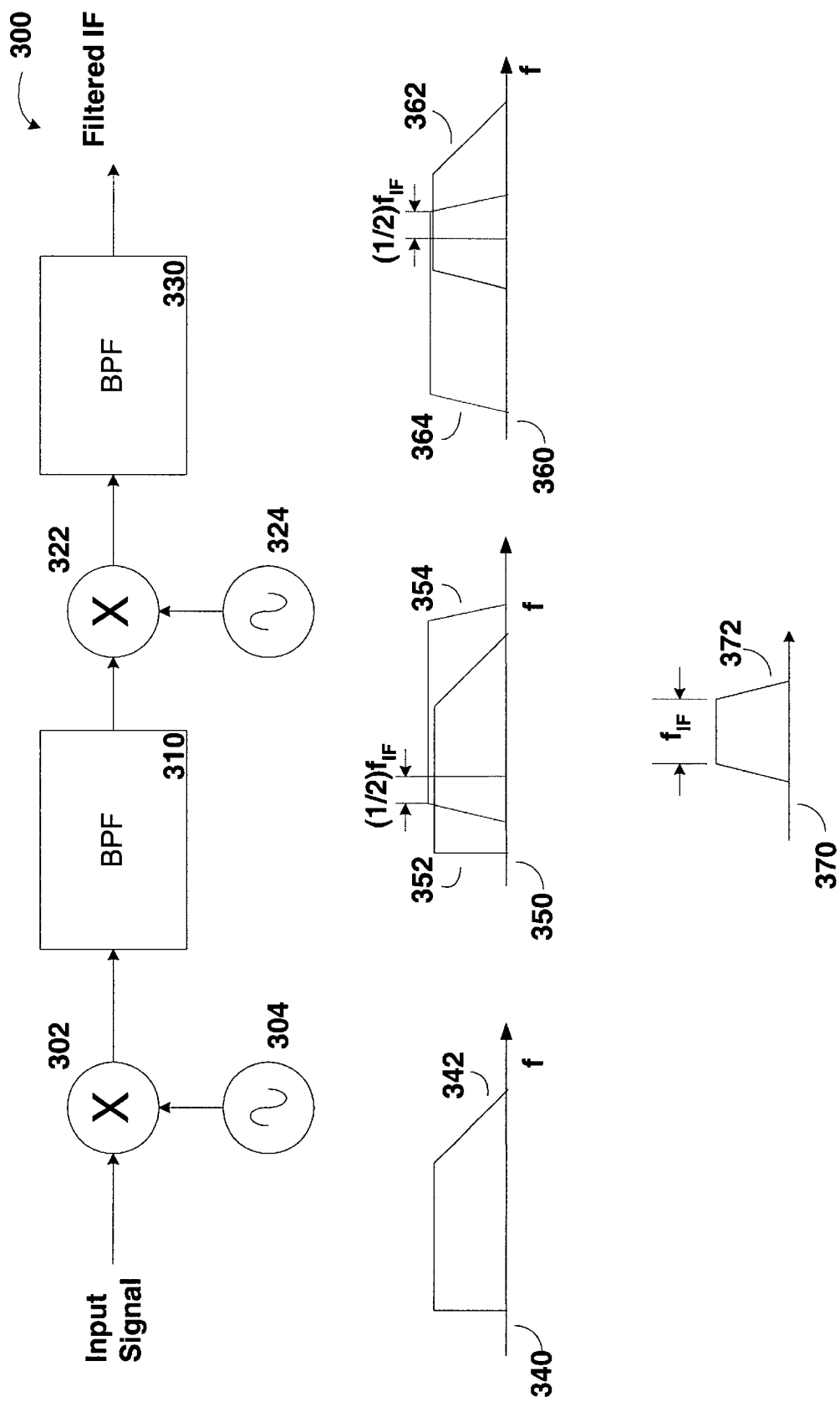
FIG. 3 is a block diagram of an embodiment of a programmable IF bandwidth filter and corresponding spectrum diagrams.

FIG. 3 shows a block diagram of a first embodiment of a programmable IF bandwidth filter implemented using fixed bandwidth filters. The programmable IF bandwidth apparatus 300 uses two frequency conversion stages and two filter stages. The input signal represents a signal that is to be filtered prior to application to subsequent stages. The input signal in a receiver may represent an RF or IF signal that is to be filtered and downconverted to baseband. The input signal in a transmitter may represent a baseband signal that is to be filtered and upconverted to an IF or RF signal to be broadcast. It can be seen from the block diagram and spectra shown in FIG. 2. that a frequency conversion stage may be configured as an upconversion or downconversion stage depending on the frequencies of the input signal and LO signal. An exemplary spectrum of an input signal 342 is shown in spectrum diagram 340. The input signal spectrum 342 is shown to be asymmetrical only for ease of illustrating the spectral properties of the frequency conversions. The bandwidth, amplitude, and spectrum shape of the input signal do not limit the operation of the programmable bandwidth IF.

The input signal 340 is applied to the input of a first frequency conversion stage. The programmable IF bandwidth apparatus 300 uses LO driven mixers as the frequency conversion stages. Other frequency conversion stages may be used including multipliers, dividers, and sampling frequency converters. The input signal is provided to a first input of a first mixer 302. The first input is commonly labeled the RF port in the case of a mixer used to downconvert a signal. The first input is commonly labeled the IF port in the case of a mixer used to upconvert a signal. The output signal from a first LO 304 is provided to a second input of the first mixer 304 commonly labeled the LO port. The first LO 304 is tunable such that the LO frequency may be controlled or programmed using an external controller (not shown). The frequency converted output from the first mixer 302 is coupled to a first filter 310. The first filter 310 must have a bandwidth that is greater than or equal to the desired IF bandwidth. In FIG. 3 the first filter 310 is shown as a bandpass filter having the shape 354 shown in spectrum diagram 350. The spectrum of the frequency converted input signal 352 is shown overlaid on the spectrum of the first IF filter 354. The first LO is tuned such that the desired center frequency of the first IF signal is offset towards a first bandedge of the first filter 310. The desired center frequency of the IF signal does not need to be the frequency converted input signal center frequency. This is because the IF filters will selectively attenuate signals above and below the desired IF center frequency such that the desired IF center frequency will actually become the measured center frequency after the programmable IF filtering stages.

The spectrum diagram 350 shows the lower bandedge as the first bandedge of the first filter 310 and the desired IF center frequency offset towards the lower filter bandedge. The first LO is tuned such that the desired IF center frequency is offset from the first bandedge of the first filter 310 by a frequency equal to one half the desired IF bandwidth. The filtered IF signal is then coupled to a second frequency conversion.

The second frequency conversion in the programmable IF bandwidth apparatus 300 is implemented with a second mixer 322 and a second LO 324. The output of the second frequency conversion is coupled to a second IF filter 330. The second IF filter 330, like the first IF filter 310, has a bandwidth that is greater than or equal to the desired IF bandwidth. However, the bandwidths of the two IF filters do not need to be the same. The second LO 324 is tuned such that the desired center frequency of the frequency converted IF signal is offset towards a first bandedge of the second filter 330. Spectrum diagram 360 shows the shape of the second filter 364 to be a bandpass filter. The first bandedge of the second filter 330 is chosen to be the upper bandedge of the bandpass filter and the second LO 324 is tuned such that the desired center frequency of the frequency converted signal is offset towards the upper bandedge. The frequency offset is chosen to be equal to one half the frequency of the desired IF bandwidth. Thus, the first filter 310 is used to shape one half of the bandwidth of the desired signal and the second filter 330 is used to filter the complementary half of the bandwidth. The resulting IF signal 372 is shown in spectrum diagram 370.

The frequency conversion stages may be implemented to convert the desired signal to any intermediate frequency. The signal may also be converted to baseband, which corresponds to a zero IF.

It can be seen from the spectrum plots of FIG. 3 that the first bandedges of the first and second filters may be chosen to be the upper bandedge and lower bandedge, respectively, without any change in the resulting IF signal. Additionally, as will be shown below, any combination of filters and any combination of first bandedges may be implemented without changing the bandwidth of the desired IF signal.

A particular implementation of the first embodiment has an input signal that has a desired signal component centered at 1000 MHz and a desired IF bandwidth of 2 MHz. The programmable IF bandwidth apparatus 300 is configured to use downconversions for both the first and second frequency conversion stages. The first LO is tuned such that the center frequency of the desired signal at the first IF falls slightly above the lower bandedge of the first filter 310. If the first filter 310 is a bandpass filter centered at 200 MHz and has a bandwidth of ±5 MHz about the center frequency the first LO is tuned to a frequency of 804 MHz. The desired IF center frequency is spaced 1 MHz, or one half the desired IF bandwidth, away from the first bandedge of the first filter. Thus, the bandwidth of the first IF filter 310 is greater than the desired IF bandwidth of 2 MHz but filters the frequency component lower than 195 MHz.

The second frequency conversion downconverts the desired signal and couples the downconverted signal to a second filter. If the second filter is a bandpass filter centered at 70 MHz with a bandwidth of +5 MHz, the second LO is tuned to a frequency of 122 MHz. Thus, the desired second IF center frequency is downconverted to 74 MHz and the upper bandedge of the second IF filter attenuates the frequency component above 75 MHz. Thus, the resultant IF bandwidth is 2 MHz but is achieved using filters that each has a bandwidth greater than 2 MHz. The choice of 10 MHz IF filters allows the apparatus to achieve any IF bandwidth up to 10 MHz by changing only the LO frequencies. This allows for a programmable IF bandwidth using only fixed bandwidth IF filters.

The maximum achievable IF bandwidth is limited by the choice of IF frequencies and filter bandwidths. The Q of the bandpass filters limits the minimum achievable IF bandwidth. The example provided above has a minimum IF bandwidth of approximately 200 KHz.

Bandpass filters may be used for the IF filters due to the advantages in filter order provided by the bandpass configuration. However, both lowpass and highpass filters may also be used as the IF filters. The programmable IF bandwidth apparatus shown in FIG. 3 uses spectrally preserving frequency conversions but this is also not a requirement.

Figure 4:
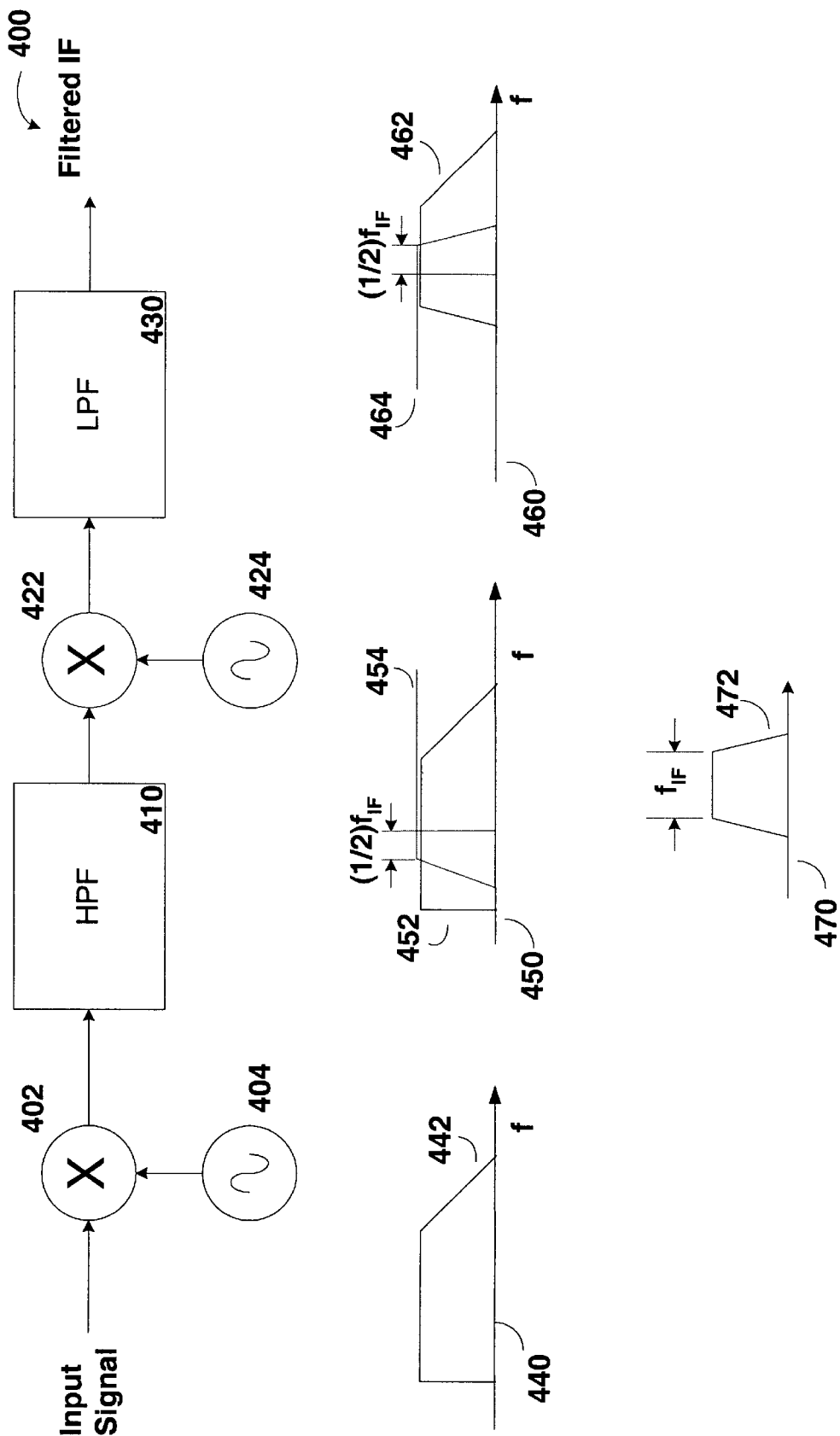
FIG. 4 is a block diagram of another embodiment of a programmable IF bandwidth filter and corresponding spectrum diagrams.

FIG. 4 shows a second embodiment of a programmable IF bandwidth apparatus 400 implemented using two frequency conversions, a single highpass filter 410, and a single lowpass filter 430. An input signal is applied to a first mixer 402 that is driven by a first LO 404. The first LO 404 is tuned such that the desired IF center frequency is offset from the first bandedge of the first IF filter 410 by one half the desired IF bandwidth. Here, the first filter 410 is a highpass filter so the first bandedge is the only filter bandedge. The filter rejects frequencies below the cutoff frequency of the highpass filter 410 as shown in the spectrum diagram 450. The frequency response of the highpass filter 454 is shown overlaid on the spectrum of the frequency converted first IF signal 452 in spectrum diagram 450. The output of the highpass filter 410 is coupled to an input of the second mixer 422 that is also driven by a second LO 424. The second LO 424 is tuned such that the desired IF center frequency of the downconverted output signal is offset from a first bandedge of the second IF filter by one half the desired IF bandwidth. The second IF filter 430 is a lowpass filter in the second embodiment so the first bandedge is the lowpass cutoff frequency. The second LO 424 is tuned to a frequency such that the desired second IF center frequency is offset from the lowpass cutoff frequency by one half the desired IF bandwidth. The spectrum of the filtered IF signal 462 along with the frequency response of the second IF filter 464 is shown in spectrum diagram 460. The resulting filtered signal 472 having the desired IF bandwidth is shown in spectrum diagram 470.

One of ordinary skill in the art will recognize that the positions of the first and second filters may be interchanged with appropriate changes to the tuning of the corresponding LO frequencies. Additionally, it may be recognized that a bandpass configuration may be substituted for either or both first and second filters.

Figure 5:
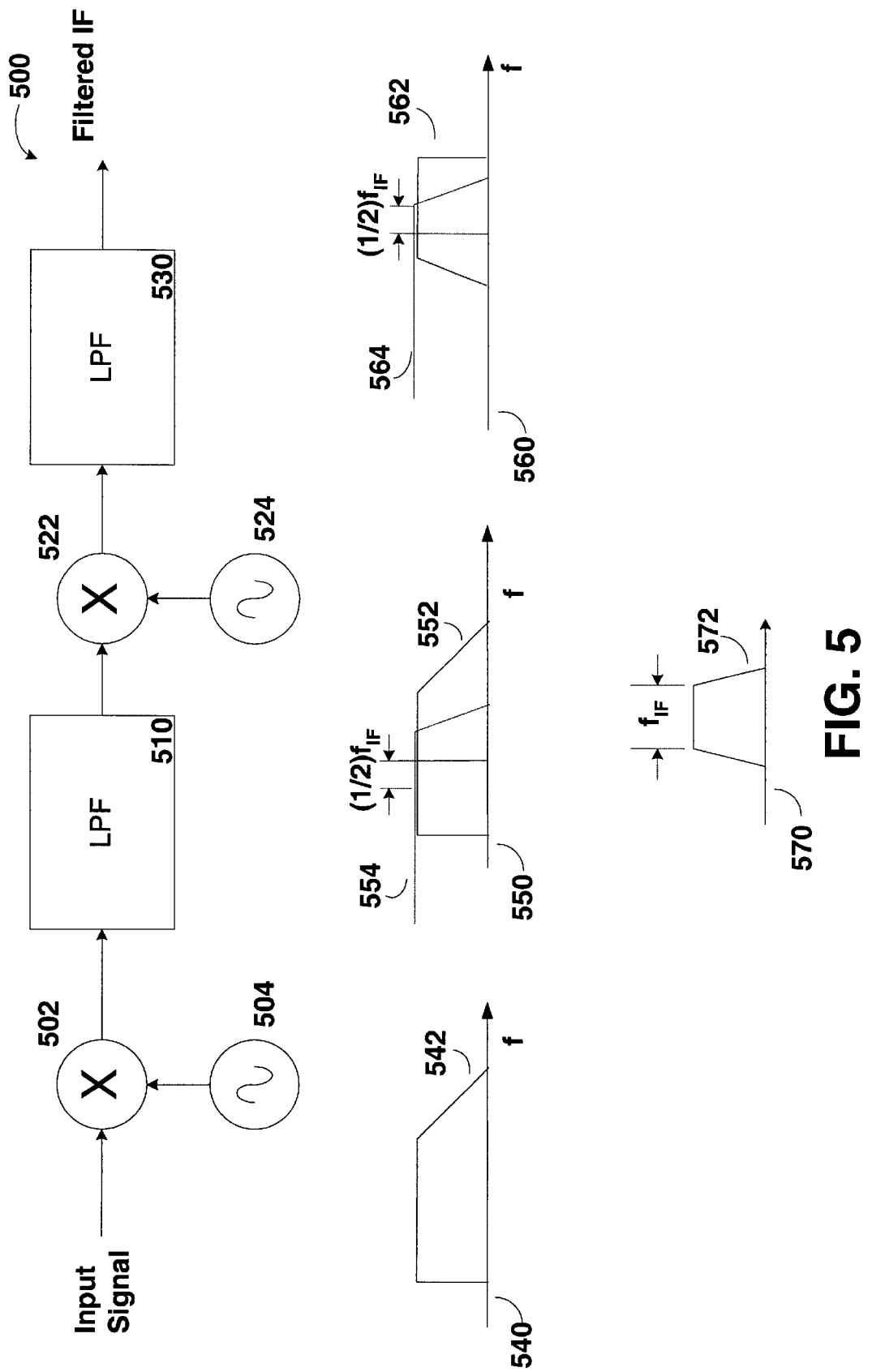
FIG. 5 is a block diagram of another embodiment of a programmable IF bandwidth filter and corresponding spectrum diagrams.

FIG. 5 shows a third embodiment of a programmable IF bandwidth apparatus 500 implemented using two frequency conversions and two lowpass filters 510 and 530. An input signal is coupled to a first input of a first mixer 502. An output of a first LO 504 is coupled to a second input of the first mixer 502. The output of the first mixer 502 is coupled to an input of a first IF filter 510. The first LO 504 is tuned such that the desired first IF center frequency is offset from a first bandedge of the first filter 510 by one half the desired IF bandwidth. In the third embodiment, the first IF filter 510 is a lowpass filter having a first bandedge equal to the lowpass cutoff frequency. The output of the first IF filter 510 is coupled to a first input of a second mixer 522. The output of a second LO 524 is coupled to a second input of the second mixer 524. The output of the second mixer 522 is coupled to a second IF filter 530. In the third embodiment, the second IF filter 530 is a lowpass filter. The second LO 524 is tuned such that the desired second IF center frequency is offset from a first bandedge of the second IF filter 530 by one half the desired IF bandwidth. However, both the first IF filter 510 and second IF filter 530 are lowpass filters. The first IF filter 510 is used to establish a first bandedge of the desired IF bandwidth and the second IF filter 530 must establish the second bandedge of the desired IF bandwidth. A spectral inversion is required if the first bandedges of the first IF filter 510 and the second IF filter 530 are both upper or lower cutoff frequencies. In the third embodiment, the second frequency conversion is configured as a spectrally inverting frequency conversion.

An exemplary input signal spectrum 542 is shown in spectrum diagram 540. The spectrum diagram 550 shows the first IF filter response 554 and the input signal after it is downconverted to a first IF 552. The first IF filter 510 attenuates signals above the lowpass cutoff frequency. The spectrum diagram 560 shows the second IF filter frequency response 564 and the output of the first IF filter after it is downconverted to the second IF 562. Note that the second frequency conversion results in a spectral inversion such that the previously unfiltered half of the downconverted signal is now filtered by the second IF filter 530. The second IF filter 530 attenuates the frequencies above the lowpass cutoff frequency and the resultant filtered signal 572 having the desired IF bandwidth is shown in spectrum diagram 570.

The IF filters in the third embodiment may be replaced with bandpass filters with no other changes. Additionally, the IF filters may be implemented as highpass filters with appropriate changes to the LO frequencies.

Thus, the embodiments shown above illustrate how a programmable IF bandwidth may be implemented with two frequency conversion stages and two filter stages, where each filter stage may be a bandpass, lowpass, or highpass filter. While each embodiment illustrates the IF filter as a single block, the actual filter may be implemented as a single filter section, multiple cascaded filter sections, or multiple cascaded filters. The embodiments also do not show any signal amplification although one of ordinary skill will realize that signal amplification may be needed. Signal amplification does not affect the operation of the programmable IF bandwidth apparatus.

Figure 6:
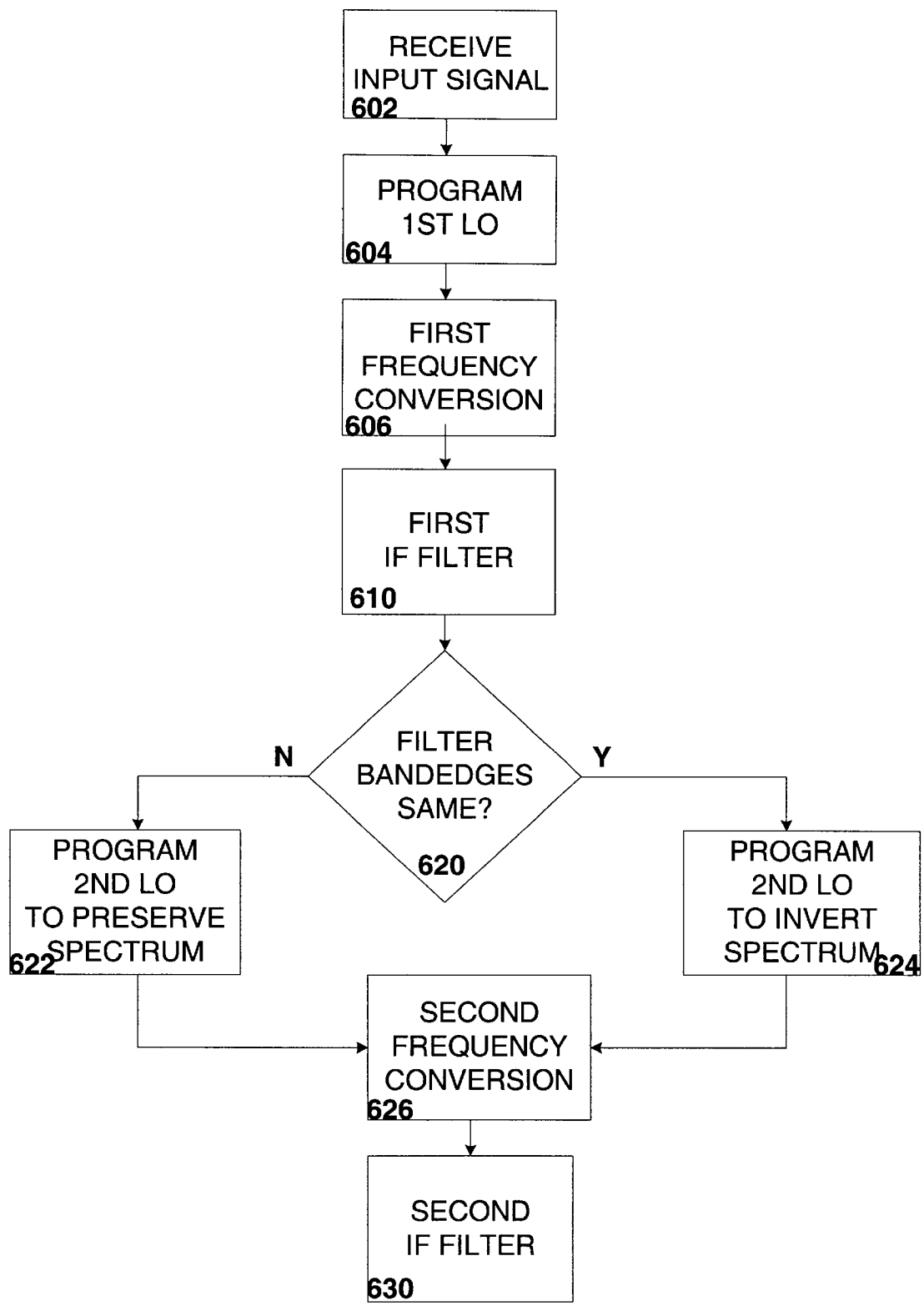
FIG. 6 is a flow chart of a method of programming a variable IF bandwidth filter.

FIG. 6 shows a flow chart of a method of programming an IF bandwidth using fixed bandwidth filters. Initially, an input signal is received 602. A first LO frequency is programmed 604 based upon the frequency of the received signal and the frequency bandwidth of the first IF filter. The frequency of the first LO is programmed to frequency convert the desired RF center frequency to a first IF 606 where the desired first IF center frequency is offset a distance equal to one half the desired IF bandwidth from a first bandedge of the first IF filter. The first LO frequency may be programmed to produce either a spectrally inverted or spectrally preserved IF replica of the input signal. The frequency converted input signal is then filtered in a first IF filter 610. A first bandwidth is established by the first IF filter. The first bandwidth may be the upper or lower bandwidth of the desired IF signal and has a bandwidth of one half the desired IF bandwidth.

The flow chart next checks to see if both the first and second IF filters are configured to filter upper or lower bandedges 620. Spectral inversion is not required if the first and second IF filters reject opposite bandedges of the desired signal. The second LO is programmed to the appropriate frequency for spectrally preserving frequency conversion 622. The second LO is tuned such that the desired second IF center frequency following the frequency conversion is offset from the first bandedge of the second IF filter bay an amount equal to one half the desired IF bandwidth. The first IF signal is then frequency converted to a second IF 626.

However, if the first IF filter and the second IF filter reject the same bandedge, a spectrally inverting frequency conversion is required. The second LO frequency is tuned to the side of the first IF filter output signal that results in a spectrally inverting frequency conversion 624. The second LO is tuned to a frequency that frequency converts the output of the first IF filter such that the desired second IF center frequency is offset from a first bandedge of the second IF filter by an amount equal to one half the desired IF bandwidth. The output of the first IF filter is then frequency converted using the second LO 628.

The output of the frequency conversion, whether spectrally preserving or spectrally inverting, is filtered in the second IF filter 630. The second IF filter is used to establish the second bandwidth of the desired IF signal. The second bandwidth of the desired IF signal is also equal to one half the desired IF bandwidth and is always opposite the first bandwidth established using the first IF filter. As an example, where the first If filter establishes the upper bandwidth the second IF filter establishes the lower IF bandwidth. Thus the total IF bandwidth is always the sum of the first bandwidth and the second bandwidth and is always equal to the desired IF bandwidth.

The use of either spectrally preserving or spectrally inverting frequency conversions allows each filter to be configured as a bandpass, lowpass, or highpass filter. The configuration of the first IF filter does not limit the configuration of the second IF filter and only constrains the programming of the second LO frequency.

Thus, it can be seen that a programmable IF bandwidth may be achieved using frequency programmable LO's and fixed bandwidth filters, where each filter has a bandwidth equal to or greater than the desired IF bandwidth.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A programmable bandwidth device comprising:
    a first frequency conversion stage having an input and an output which includes:
        a first mixer having a first input, second input, and output, wherein the first input of the first mixer is the input of the first frequency conversion and the output of the first mixer is the output of the first frequency conversion stage; and
        a first Local Oscillator (LO) having an output coupled to the second input of the first mixer,
    wherein the first LO is programmed to produce a first LO output frequency to frequency convert an input frequency to a desired first IF center frequency that is offset from a first bandedge of the first IF filter by the first signal bandwidth;
    a first Intermediate Frequency (IF) filter having an input and an output, with the first IF filter input coupled to the output of the first frequency conversion stage, wherein the first IF filter establishes a first signal bandwidth;
    a second frequency conversion stage having an input and an output, with the input of the second frequency conversion stage coupled to the output of the first IF filter, the second frequency conversion stage includes:
        a second mixer having a first input, second input, and output, wherein the first input of the second mixer is the input of the second frequency conversion and the output of the second mixer is the output of the second frequency conversion stage; and
        a second Local Oscillator (LO) having an output coupled to the second input of the second mixer,
    wherein the second LO is programmed to produce an output frequency to frequency convert a desired first IF center frequency to a desired second IF center frequency that is offset from a first bandedge of the second IF filter by the second signal bandwidth; and
    a second IF filter having an input coupled to the output of the second frequency conversion stage, wherein the second IF filter establishes a second signal bandwidth and wherein the total IF bandwidth is equal to the sum of the first signal bandwidth and the second signal bandwidth.

2. The device of claim 1 wherein the first bandedge of the first IF filter is at a first IF cutoff frequency greater than the desired first IF center frequency.

3. The device of claim 2 wherein the first bandedge of the second IF filter is at a second IF cutoff frequency less than the desired second IF center frequency.

4. The device of claim 3 wherein the second frequency conversion is a spectrally preserving frequency conversion.

5. The device of claim 2 wherein the first bandedge of the second IF filter is at a second IF cutoff frequency greater than the desired second IF center frequency.

6. The device of claim 5 wherein the second frequency conversion is a spectrally inverting frequency conversion.

7. The device of claim 1 wherein the first bandedge of the first IF filter is at a first IF cutoff frequency less than the desired first IF center frequency.

8. The device of claim 7 wherein the first bandedge of the second IF filter is at a second IF cutoff frequency less than the desired second IF center frequency.

9. The device of claim 1 wherein the bandwidths of the first IF filter and the second IF filter are fixed frequency bandwidths and each of the filter bandwidths are greater than the total IF bandwidth.

10. The device of claim 9 wherein the first IF filter is implemented as a bandpass, lowpass, or highpass filter.

11. The device of claim 10 wherein the second IF filter is implemented as a bandpass, lowpass, or highpass filter.

12. The device of claim 9 wherein the first signal bandwidth is essentially equal to the second signal bandwidth.

13. The device of claim 1 wherein both the first frequency conversion stage and the second frequency conversion stage perform frequency upconversion.

14. The device of claim 1 wherein both the first frequency conversion stage and the second frequency conversion stage perform frequency downconversion.

* * * * *